United States Patent
Wen et al.

(10) Patent No.: US 6,621,276 B2
(45) Date of Patent: Sep. 16, 2003

(54) TERMINATION ASSEMBLY FOR POWER CABLE TESTING AND METHODS FOR ITS USE

(75) Inventors: Yingli Wen, Lexington, SC (US); André Pion, Granby (CA); Nathan J. Kelly, Columbia, SC (US); Claude Hébert, Chambly (CA)

(73) Assignee: Pirelli Cavi e Sistemi S.p.A., Milan (IT)

( * ) Notice: Subject to any disclaimer, the term of this patent is extended or adjusted under 35 U.S.C. 154(b) by 0 days.

(21) Appl. No.: 09/745,451

(22) Filed: Dec. 26, 2000

(65) Prior Publication Data

US 2002/0079904 A1 Jun. 27, 2002

(51) Int. Cl.[7] .......................... H01H 31/02; H02G 15/22
(52) U.S. Cl. ........................... 324/541; 324/539; 174/19
(58) Field of Search ................................ 324/514, 513, 324/512, 539, 540, 541, 542, 533; 174/19, 73.1, 139

(56) References Cited

U.S. PATENT DOCUMENTS

| 1,147,821 A | | 7/1915 | Smith | |
|---|---|---|---|---|
| 3,702,895 A | * | 11/1972 | DeSil | 174/139 |
| 4,794,339 A | * | 12/1988 | LeNir | 324/540 |
| 5,142,104 A | | 8/1992 | McArdle | 174/74 |
| 5,160,893 A | * | 11/1992 | Lamson | 324/533 |
| 5,760,590 A | * | 6/1998 | Striffler | 324/514 |

FOREIGN PATENT DOCUMENTS

JP          07-333289          12/1995

OTHER PUBLICATIONS

EPO Search Report dated May 5, 2002.

* cited by examiner

*Primary Examiner*—N. Le
*Assistant Examiner*—Donald M Lair
(74) *Attorney, Agent, or Firm*—Finnegan, Henderson, Farabow, Garrett & Dunner, L.L.P.

(57) ABSTRACT

A cable termination assembly for testing the quality of insulation surrounding a power cable has one termination design to fit a large range of cable constructions, does not require different insulation shield cut-back distances, provides a secure electrical connection, and is environmentally friendly. A cable grip assembly is attached to an exposed conductor. The bottom outer surface of an inner cup is attached to the inner bottom surface of an outer cup wherein the inner cup is fully contained in the outer cup. When the two cups are attached, the cable grip assembly is mateably connected into the top of the inner cup and the outer cup is filled with a high dielectric strength liquid covering the inner cup and the cable grip assembly. After the high dielectric strength liquid has been added, a voltage is applied and the partial voltage discharge of the power cable is measured.

26 Claims, 10 Drawing Sheets

TERMINATION ASSEMBLY FOR POWER CABLE TESTING AND METHODS FOR ITS USE

BACKGROUND OF THE INVENTION

The present invention relates generally to a termination assembly for a power cable. More particularly, the present invention relates to a power cable termination assembly used for power cable testing after manufacture.

Quality testing is performed on a length of finished power cable at the end of the manufacturing process. In the art, one such quality test is a high potential test where the finished cable is subjected to an alternating current voltage of approximately three to four times the tested cable's rated operating voltage. With this voltage applied, partial discharge, also referred to as corona, from the cable is measured to determine the insulation quality. If partial discharge greater than a specified magnitude is present under such high potential testing, the tested power cable is defective and probably contains voids or contaminants within the cable insulation. Basically defined, partial discharge is the phenomenon whereby air ionizes and begins to conduct electricity under high voltage conditions. In some cases, partial discharge can produce light, noise, and even ozone.

During the testing process, however, if the cable end is not properly terminated, partial discharge will occur at the cable termination even when the insulation contains no defects. The existence of partial discharge at the termination can hinder the detection of flaws in the cable insulation because when partial discharge occurs at the cable termination, its origin may be difficult to determine. In this case, testing techniques cannot distinguish the source, which may either be a defect in the cable insulation or ionized air at the cable termination. When a material with a high ionization voltage surrounds a cable termination, however, the ionization at that termination is greatly reduced or nearly eliminated.

Figure 1:
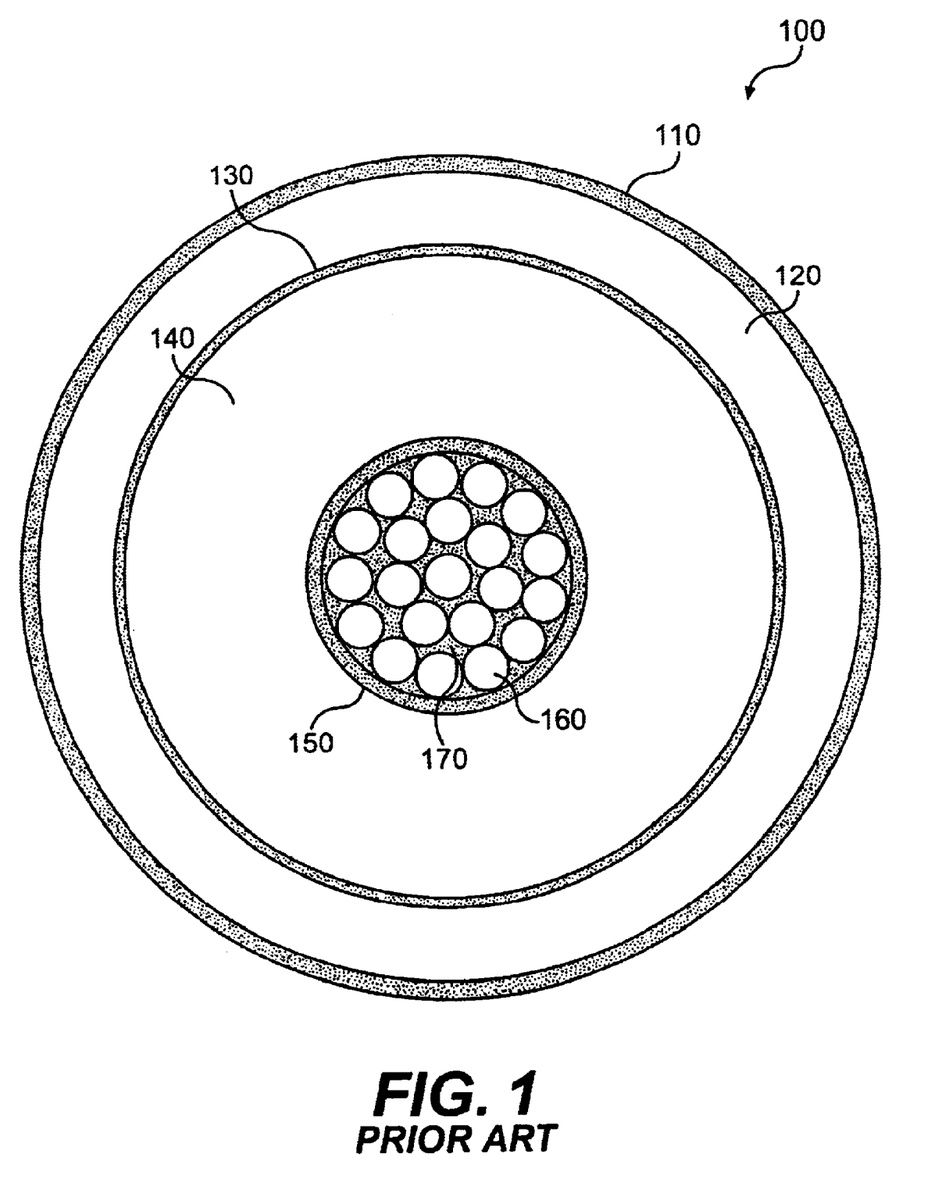
FIG. 1 is a circumferential cross-sectional view of an exemplary cable comprising a stranded conductor and a primary tape shield according to the present invention.

FIG. 1 shows an exemplary conventional cable 100 containing a jacket 110, a primary shield 120, an insulation shield 130, insulation 140, conductor shield 150, stranded conductor 160, and strand seal 170. Those skilled in the art will appreciate that other cable constructions, including various voltage ratings, may be used in conjunction with the present invention.

Jacket 110 provides thermal, mechanical, and environmental protection of the layers underneath it. Jacket 110 is optional and may be constructed of polyethylene, PVC, or nylon.

Next to the jacket, primary shield 120 may be made of a circumferentially corrugated metal tape, drain wires or a concentric neutral. A concentric neutral 120', shown in FIG. 2, comprises a plurality of electrically conductive strands placed concentrically around insulation shield 130. The concentric neutral 120' serves as a neutral return current path and must be sized accordingly. The insulation shield 130 is usually made of an extruded semiconducting layer that is partially bonded to the insulation 140. Primary shield 120, insulation shield 130, and conductor shield 150 are used for electrical stress control providing for more symmetry of the dielectric fields within cable 100.

The insulation 140, contained beneath insulation shield 130, is an extruded layer which provides electrical insulation between conductor 160 and the closest electrical ground, thus preventing an electrical fault. Generally, insulation 140 is made of polyethylene, crosslinked polyethylene, or ethylene-propylene rubber. Polyethylene is susceptible to degradation due to partial discharge which may in turn lead to "water treeing". Water treeing is the phenomenon whereby small tree-like voids form and grow in the insulation 140 and fill with water that may have ingressed through the conductor strands. If a tree grows large enough in the insulation 140, electrical breakdown, and thus cable failure, will occur between the conductor 160 and an electrical ground. Crosslinked polyethylene is a significant improvement to polyethylene and, like ethylene-propylene rubber, is less susceptible to electrical breakdown due to water treeing. Also, ethylene-propylene rubber is more flexible than polyethylene or crosslinked polyethylene.

Conductor shield 150 is generally made of a semiconducting material and surrounds conductor 160. As stated previously, conductor shield 150 is used for electrical stress control, providing for more symmetry of the dielectric fields within the cable 100. Conductors are normally either solid or stranded, and are made of copper, aluminum or aluminum alloy. The purpose of stranding the conductor is to add flexibility to the cable construction. The small spaces between the strands of a stranded conductor, however, provide a path for water to ingress the cable 100. As stated previously, water can aggravate the treeing problem within insulation 140, accelerating cable failure. In an attempt to alleviate this problem, strand seal 170 is added into the small spaces between the strands. While the strand seal tends to limit the water ingress, it does, however, add to the stiffness of the cable 100. A solid conductor 160' construction is shown with respect to FIG. 2, as an example of a construction not requiring strand seal.

Figure 3:
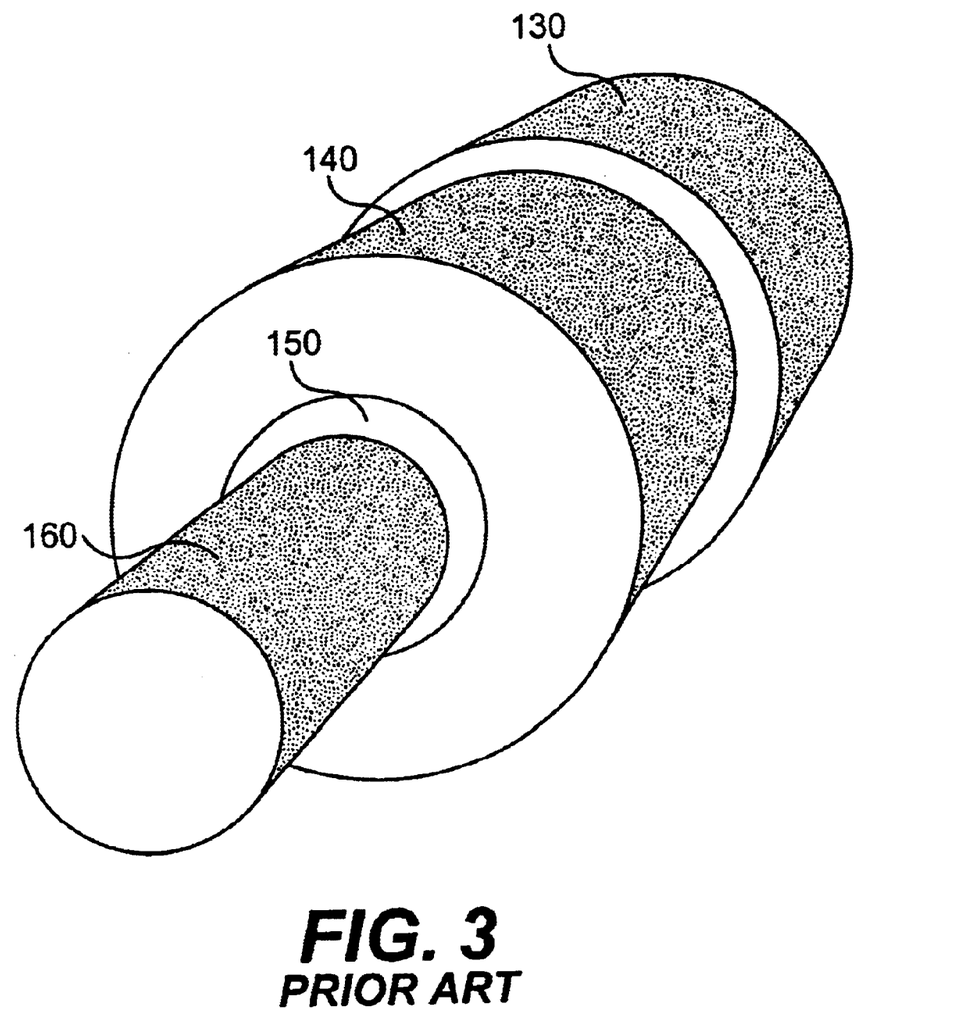
FIG. 3 is an isometric view of an exemplary cable according to the present invention.

FIG. 3 illustrates an exemplary conventional cable prepared for a termination assembly. To prepare the cable for termination, jacket 110 (not shown) and primary shield 120 (not shown) are first removed for a predetermined distance, exposing insulation shield 130. Second, insulation shield 130 is cut circumferentially at a predetermined distance from the end of the cable and that portion of insulation shield 130 is removed from the insulation 140. At last, a circumferential cut close to the end of the cable is made through insulation 140 and conductor shield 150. After this cut is made, a portion of the insulation 140 and conductor shield 150 at the end of the cable are removed, exposing conductor 160 at the cable end. When testing the quality of the insulation, cable manufacturers currently employ several techniques to limit partial discharge not caused by defects in the insulation.

For example, most cable manufacturers currently use resistive paint as a mechanism for limiting partial discharge at a cable termination. Using this method, the insulation shield is cut circumferentially at a certain distance from the cable end. Care must be taken to cut completely through the insulation shield without scoring the insulation. The insulation shield at the cable end is then removed, exposing the insulation surface. A thin layer of resistive paint is applied over the exposed insulation surface around the cable circumference overlapping the insulation shield by about one inch and extending to near the end of the cable. The layer of resistive paint provides a resistive current path, which results in a linear distribution of the electrical stress along the cable end, thus limiting partial discharge.

The effectiveness of this method, however, depends heavily on the cable construction, characteristics of the resistive paint, and the length of the insulation shield. Different cable insulating materials or different cable sizes, therefore, require resistive paint of different electrical characteristics or different insulation-shield-strip-back distances. This requires the technician performing the test to have a variety of different resistive paints available and to apply a different strip-back distance for the variety of different cables tested, which adds to the complexity of the testing process.

Another major problem associated with the resistive paint method is that it requires special handling because the paint dries quickly and chips very easily. Once the paint chips, the chips can act as sharp electrodes and can cause significant partial discharge in the area, which aggravates the very problem the resistive paint was intended to overcome. In addition, the resistive paint is not completely compatible with ethylene-propylene rubber, a commonly used cable insulation. Due to the chemical characteristics of ethylene-propylene rubber, when resistive paint is applied, bare spots may form on the painted area of the insulation, resulting in partial discharge when a voltage is applied to the cable.

The stress-cone method is less frequently practiced by cable manufacturers. A stress cone is a prefabricated cable termination device made of a high permittivity material. Once applied to a cable of an appropriate design, a stress cone provides stress relief. To install the stress cone, the cable end is prepared in the same way as with the resistive paint. In preparing the cable end, the insulation shield is cut circumferentially at a certain distance from the cable end. Care must be taken to cut completely through the insulation shield without scoring the insulation. The insulation shield at the cable end is then removed, exposing the insulation surface. After the cable is prepared, the stress cone is slipped over the cable and sits over the insulation shield cutback. When installing the stress cone, silicon grease is normally used as a lubricant and as a filler for the voids that may be present between the cable and the stress cone. The drawbacks of stress cones are: 1) they are available in limited voltage ranges; 2) they must be kept in inventory, thus increasing inventory costs, and 3) they have poor range-taking capability. Each drawback tends to increase the testing process cost.

A third and rare practice is to use stationary oil bottles made of Plexiglas®. These bottles are about two feet long, six inches in diameter and are mounted on stationary stands. Each bottle is filled with hardened steel balls (such as ball bearings) and has a bottom cap made of aluminum. A brass electrode is connected to the outside of the bottom cap. To terminate the cable, the various cable layers are stripped back to various lengths. The exposed conductor end is placed between the steel balls in the bottle filled with dielectric oil.

The majority of cable manufacturers have abandoned this practice because of its many drawbacks. These drawbacks include: 1) excessively long cable ends increase scrap costs; 2) the stands necessary to support the bottles take up a large area and significantly reduce the number of cables that can be tested at one time in a given area; and 3) for large cables, it is difficult to install the termination due to the bottle's fixed position. An additional drawback includes losing electrical contact if vibration is present. Electrical contact can be lost in the oil-bottle method because the conductor only contacts the electrode via the steel balls. Vibration may be great enough to overcome the frictional forces holding the conductor in place.

Applicants have discovered that conventional techniques do not provide a cable termination assembly for cable quality testing that provides one termination design to fit a large range of cable constructions, that does not require different insulation shield strip-back distances, that provides a secure electrical connection, and that is environmentally friendly.

SUMMARY OF THE INVENTION

In accordance with the current invention, a cable termination assembly is provided that avoids the problems associated with prior art cable terminations as discussed herein above.

In one aspect, a method for testing an electrical power cable consistent with the invention includes providing a conductor with a first length of exposed conductor and a second length of materials layered around the conductor. Once the conductor is provided, a cable grip assembly is fastened to the first length of exposed conductor. Preferably, layers of metallic tape may be applied around the first length of the conductor. Also, a conductive sphere may be attached to the first length of the conductor and then placed in and fastened to the cable grip assembly.

After the cable grip assembly is fastened to the conductor, the cable grip assembly is connected mateably to the inside of the outer cup. Preferably, this may be accomplished by allowing the bottom outer surface of an inner cup to be attached to the inner bottom surface of an outer cup wherein the inner cup is fully contained in the outer cup. Once the two cups are attached, the cable grip assembly may be mateably connected into the top of the inner cup, wherein the inner cup completely contains the cable grip assembly. Preferably, the cable grip assembly may be connected to the inner cup by aligning keyway pins protruding from the inner cup with keyways placed in the exterior of the cable grip assembly and locking the keyway pins in the keyways. Alternatively, the cable grip assembly may be connected to the inner cup by snapping push pins protruding from the interior of the inner cup into a circumferential groove placed in the exterior of the cable grip assembly.

With the cable grip assembly connected mateably to the inside of the outer cup, the outer cup is filled with a high dielectric strength liquid covering the inner cup and the cable grip assembly. Preferably, the outer cup may comprise a tube made of an electrically non-conductive material and an end cap made of an electrically conductive material mateably connecting to one end of the tube. Once the high dielectric strength liquid has been added, a voltage is applied to the bottom of the outer cup. This voltage is transferred from the bottom of the outer cup, to the inner cup, to the cable grip assembly, and to the conductor. Preferably, the partial voltage discharge of the cable may be measured to determine the quality of the insulation.

In another aspect, a cable termination apparatus consistent with the invention includes a cable grip assembly configured to grasp and electrically connect to a first end of a conductor associated with a first end of a cable. Preferably, the conductor may be solid or stranded and may be made of copper, aluminum, or aluminum alloy. Also, the insulation layered around the conductor may be made polyethylene, crosslinked polyethylene, or ethylene-propylene rubber. In addition, layers of metallic tape may be applied around the first length of the conductor.

Preferably, the cable grip assembly may comprise a support sleeve, grip pins slideably connected to the interior of the support sleeve operable collectively to grasp the first end of the conductor, and a piston. The piston is rotatable in a first direction to cause the grip pins to grasp and electrically connect to the first end of the conductor, and rotatable in a second direction to cause the grip pins to release and electrically disconnect from the first end of the conductor. Alternatively, the cable grip assembly may comprise a support sleeve, a clamping rod traversing the interior of the support sleeve operable for rotating in a first direction and in a second direction, and opposing grip pins. The opposing grip pins are operable for moving along the clamping rod and operable collectively to grasp the first end of the conductor. The clamping rod may be rotated in a first direction to cause the grip pins to grasp and electrically connect to the first end of the conductor, and may be rotated in a second direction to cause the grip pins to release and electrically disconnect from the first end of the conductor.

Preferably, an inner cup may be mateably attached around and electrically connected to the cable grip assembly. Preferably, the cable grip assembly may be connected to the inner cup by aligning keyway pins protruding from the inner cup with keyways placed in the exterior of the cable grip assembly and locking the keyway pins in the keyways. Alternatively, the cable grip assembly may be connected to the inner cup by snapping push pins protruding from the interior of the inner cup into a circumferential groove placed in the exterior of the cable grip assembly. In addition, slots may be placed in the exterior of the cable grip assembly perpendicular to the circumferential groove and extending from the circumferential groove to the end of the cable grip assembly. The cable grip assembly may be released from the inner cup by rotating the cable grip assembly until the push pins align with the slots and by pulling the cable grip assembly from the inner cup.

And finally, an outer cup is mateably attached around the cable grip assembly. Preferably, this may be accomplished by attaching the cable grip assembly to an inner cup and then attaching an outer cup mateably around the inner cup. The outer cup contains a high dielectric fluid covering the cable grip assembly, and covering a length of the first end of the conductor. Preferably, the outer cup may comprise a tube made of an electrically non-conductive material and an end cap made of an electrically conductive material mateably connecting to one end of the tube. In addition, the cable termination apparatus may also include a voltage source configured to supply voltage to the first end of the conductor via the outer cup, the inner cup, and the cable grip assembly.

In yet another aspect, a method for testing an electrical power cable consistent with the invention includes a conductor with a first length of exposed conductor and a second length of materials layered around the conductor. Once the conductor is provided a first tube is fastened through the bottom of a second tube. Next, the cable is placed through the second tube and down through the first tube, wherein the first length of exposed conductor protruding from the first tube. Then the second tube is filled with a high dielectric strength liquid and a voltage is applied to the first length of exposed conductor. Preferably, the partial voltage discharge of the cable may be measured to determine the quality of the insulation.

It is to be understood that both the foregoing general description and the following detailed description are exemplary and explanatory only and are intended to provide further explanation of the invention as claimed. The following description, as well as the practice of the invention, set forth and suggest additional advantages and purposes of the invention.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION OF THE PREFERRED EMBODIMENTS

Reference will now be made to various embodiments according to this invention, examples of which are shown in the accompanying drawings and will be obvious from the description of the invention. In the drawings, the same reference numbers represent the same or similar elements in the different drawings whenever possible.

The present invention is directed to a system and method for terminating a cable for testing the quality of its insulation. The invention provides one termination design to fit a large range of cable constructions, does not require different insulation shield strip-back distances, provides a secure electrical connection, and is environmentally friendly.

For example, a cable is provided comprising a conductor with materials layered around the conductor. These layers include an insulation layer. The materials layered around the conductor are removed longitudinally for a first length along the first end of the cable exposing a first length of conductor. Once the conductor is exposed, a cable grip assembly is attached. The cable grip assembly may include multiple grip pin contacts or a snap-on contact termination.

After the cable grip assembly is attached to the conductor, the bottom outer surface of an inner cup is attached to the inner bottom surface of an outer cup wherein the inner cup is fully contained in the outer cup. Once the two cups are attached, the cable grip assembly is mateably connected into the top of the inner cup, wherein the inner cup completely contains the cable grip assembly. With the cable grip assembly in the inner cup, the outer cup is filled with a high dielectric strength liquid covering the inner cup and the cable grip assembly.

Once the high dielectric strength liquid has been added, a voltage is applied to the bottom of the outer cup. This voltage is transferred from the bottom of the outer cup, to the inner cup, to the cable grip assembly, and to the conductor. After the voltage is applied, the partial voltage discharge of the cable is measured.

Figure 2:
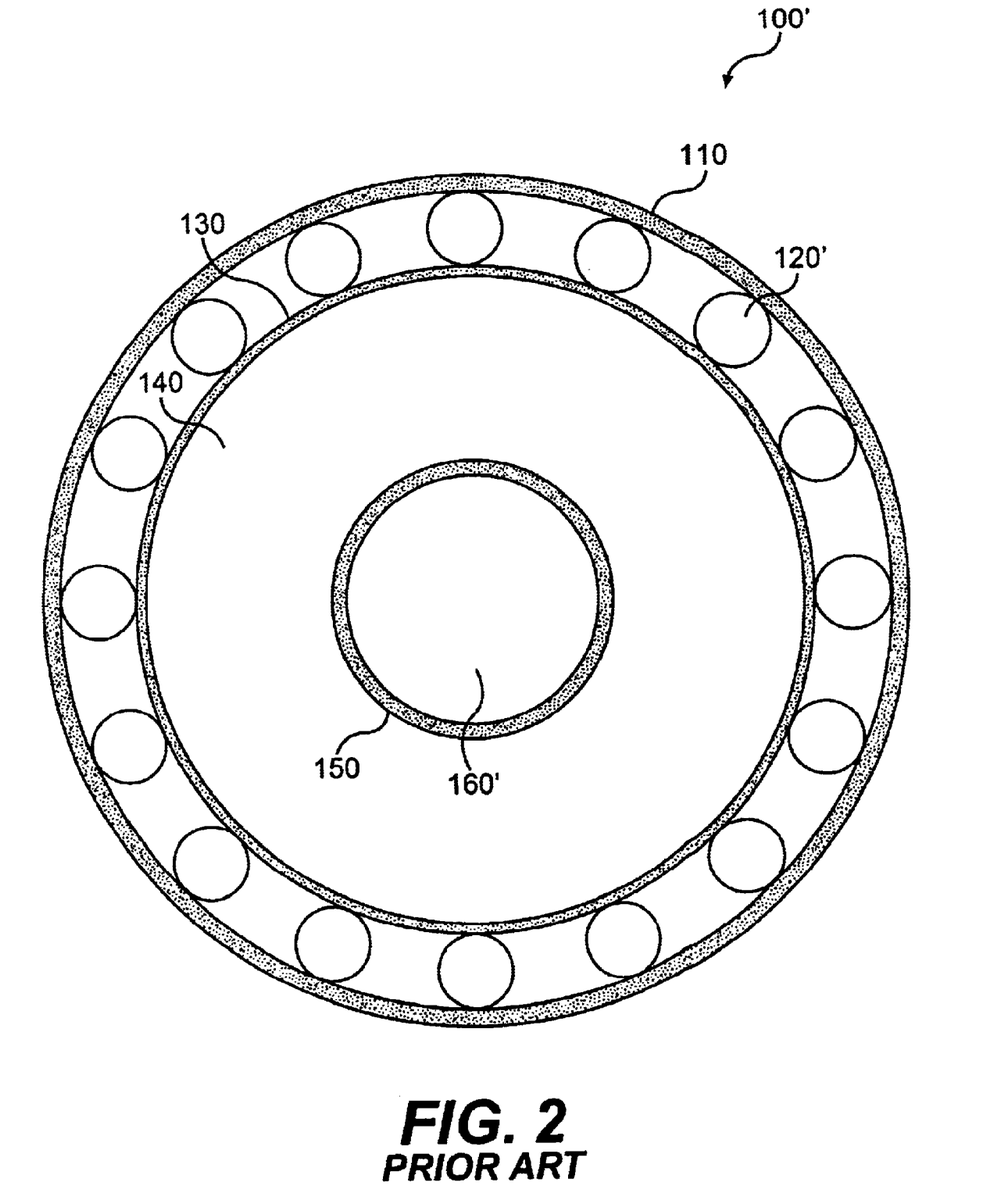
FIG. 2 is a circumferential cross-sectional view of an exemplary cable comprising a solid conductor and a concentric neutral according to the present invention.
Figure 4A:
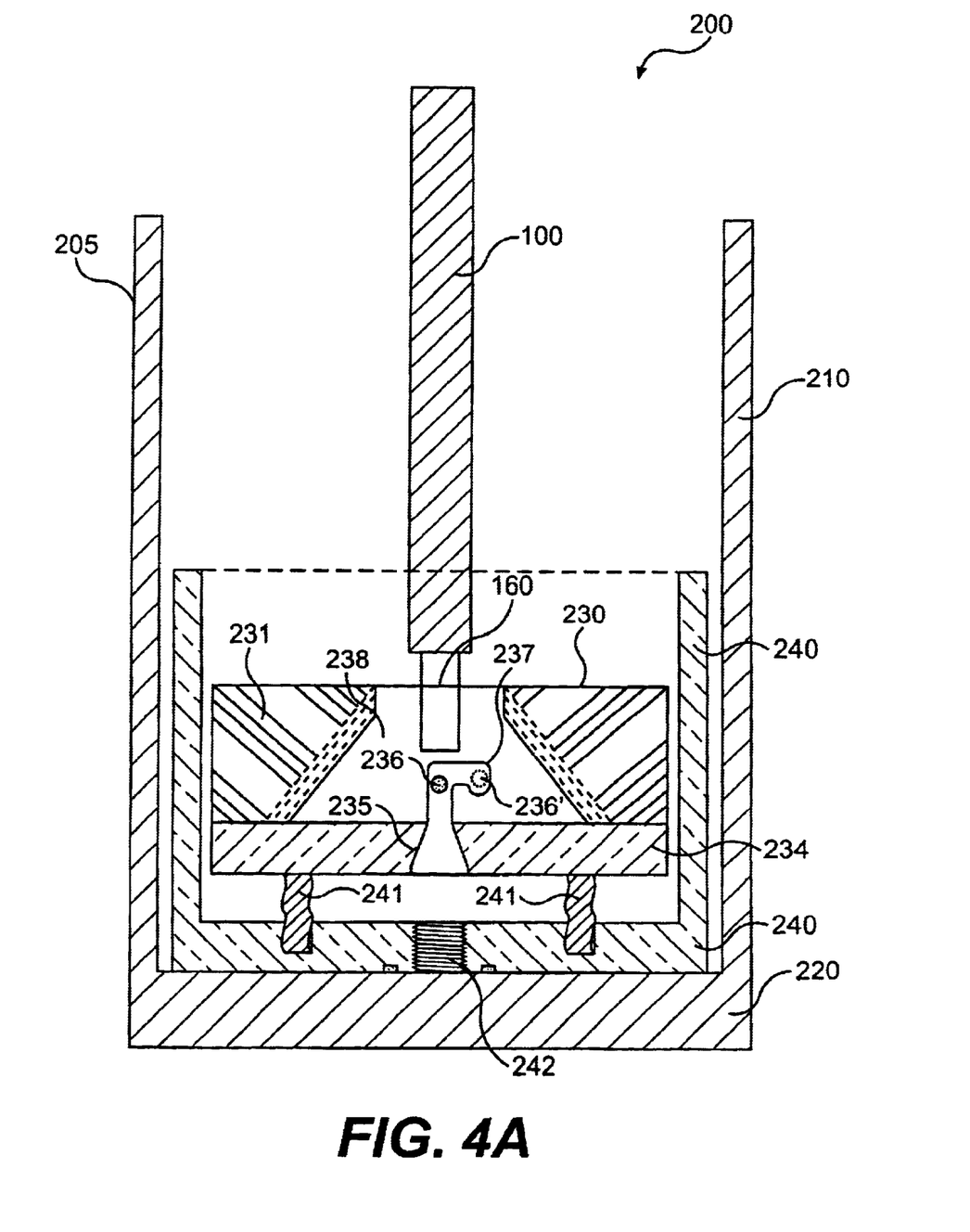
FIG. 4A is an axial cross-sectional view of a three grip pin contact termination assembly according to a first embodiment of the present invention.
Figure 4B:
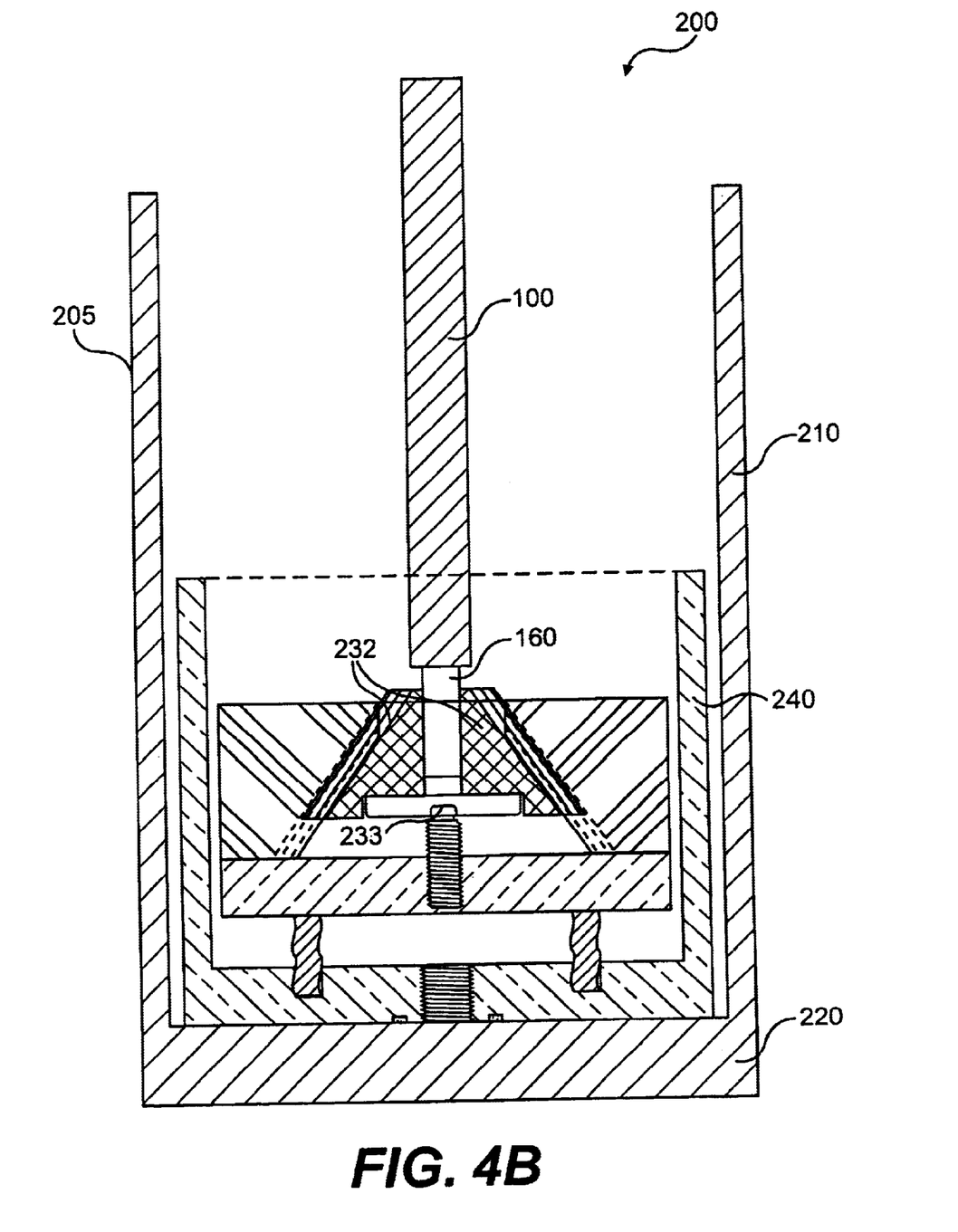
FIG. 4B is an axial cross-sectional view of a three grip pin contact termination assembly according to a first embodiment of the present invention.

FIGS. 4A and 4B illustrate a cable termination assembly in accordance with a preferred embodiment of the present invention. Generally shown is a cable 100 including a center conductor 160 as illustrated in FIGS. 1 through 3. A three grip pin contact termination assembly 200 consists of an outer cup 205, a keyed inner cup 240 and a support sleeve cable grip assembly 230. The outer cup 205 comprises a tube 210, which can be made of Acrylic, PVC, or other types of non electrically conductive materials, and an end cap 220 made of aluminum, or other types of electrically conductive materials. The end cap 220 mateably connects and attaches to the tube 210 by screwing or any similar sealing and attaching means.

The keyed inner cup 240, made of aluminum or other types of electrically conductive material, comprises three springs 241, three keyway pins 236 and an inner cup fastener 242. The three springs 241 are vertically placed and evenly circumferentially spaced in the bottom of the inner cup 240. The three keyway pins 236 are evenly spaced and protrude horizontally from the interior wall of the keyed inner cup 240. The inner cup fastener 242 is placed in the bottom center of the inner cup 240 and allows for the keyed inner cup 240 to be attached and electrically connected to the end cap 220.

The support sleeve cable grip assembly 230, made of aluminum or other types of electrically conductive material, comprises a support sleeve 231, three grip pins 232, a piston 233, and a base plate 234. On the outside wall of the support sleeve 231 are three keyways 235 for connecting the support sleeve cable grip assembly 230 to the keyed inner cup 240.

The conductor 160, as prepared in accordance with FIG. 3, is inserted into the cavity 238 in the support sleeve cable grip assembly 230. Once the conductor 160 is inserted, the piston 233 at the bottom of the support sleeve cable grip assembly 230 is turned to close the support sleeve cable grip assembly 230. In turning the piston 233, the three grip pins 232 slide along in grooved slots in the support sleeve 231, pressing the three grip pins 232 hard on the conductor 160 to secure the cable 100 and to make electrical contact.

The support sleeve cable grip assembly 230 is mateably inserted into the keyed inner cup 240. The three keyways 235 are aligned with three keyway pins 236 on the inner wall of keyed inner cup 240. The support sleeve cable grip assembly 230 is inserted until the three keyway pins 236 reach the end of the three keyways 235. Once the three keyway pins 236 reach the end of the three keyways 235, the support sleeve cable grip assembly 230 is turned and locked into place. This locking is accomplished by the three springs 241 which hold the three keyway pins 236 in saddle slots 237 located in the three keyways 235. This locked position of the three keyway pins 236 is shown in FIG. 4A as element 236'. The three springs 241 support the cable grip assembly and provide an electrical path between the support sleeve cable grip assembly 230 and the keyed inner cup 240 through the three springs 241. In addition, the three springs 241 help insure the electrical connection between the support sleeve cable grip assembly 230 and the keyed inner cup 240 by applying pressure to keep the support sleeve cable grip assembly 230 and the keyed inner cup 240 in physical contact.

Figure 5:
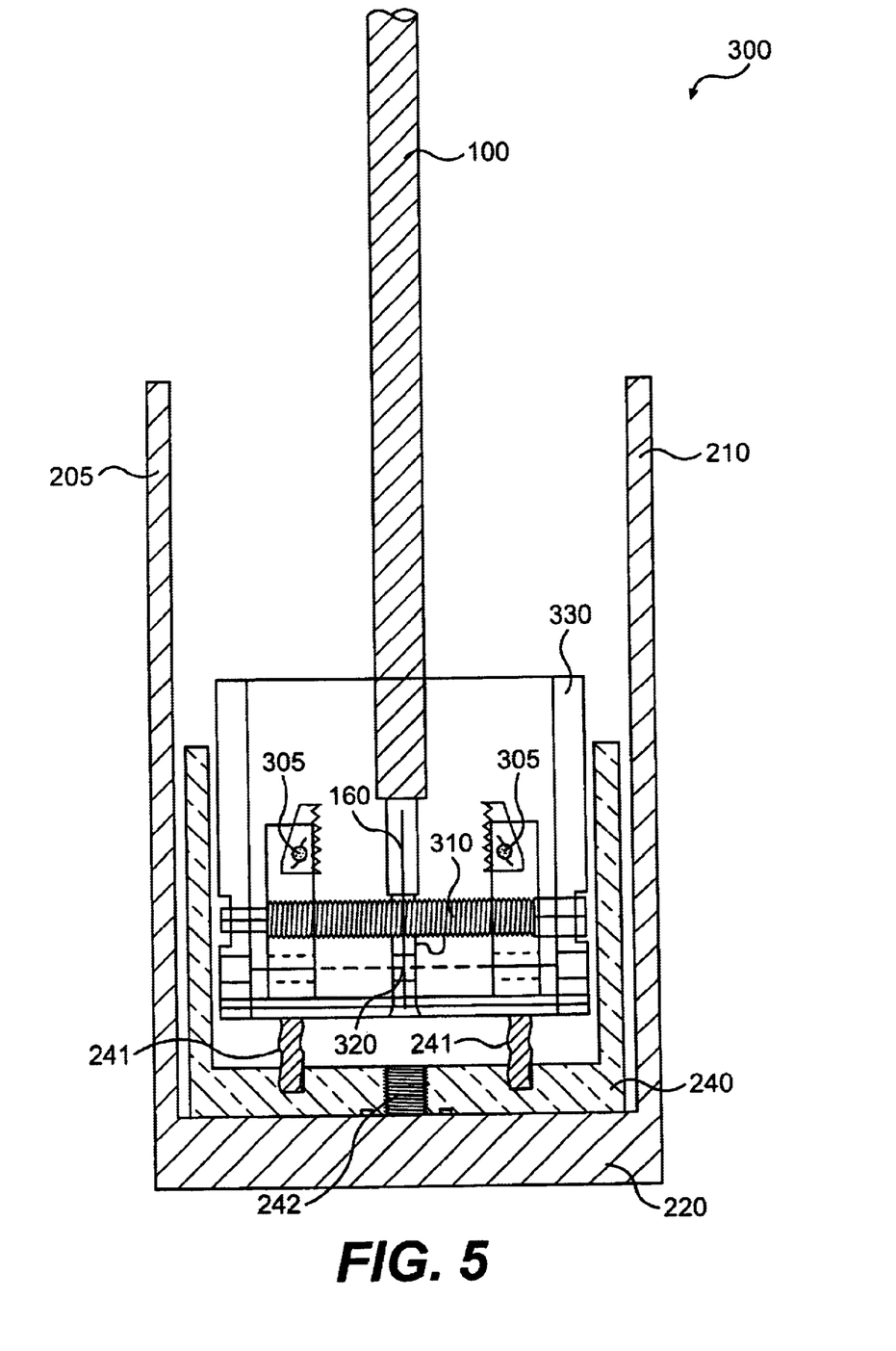
FIG. 5 is an axial cross-sectional view of a two grip pin contact termination assembly according to a second embodiment of the present invention.

Turning now to a second embodiment of the present invention shown in FIG. 5, two grip pin contact termination assembly 300, is shown, which is an alternative design of the three grip pin contact termination assembly 200. In the two grip pin contact termination assembly 300 of FIG. 5, the support sleeve 231 of FIG. 4A is replaced by a cylindrical cable grip assembly 330. The two grip pin contact termination assembly 300 comprises two grip pins 305, a quick-release clamping rod 310, and three keyways 320. The gripping surface on each grip pin can be flat with teeth for gripping action. For a more stable grip, the toothed gripping surface can be curved to contour the conductor 160. To accommodate a range of conductor sizes, each pair of grip pins 305 preferably comprises of a grip pin having a small curve sized to the lower limit of the range and another grip pin curve sized to the higher limit of the range.

The two grip pins 305 move along the quick-release clamping rod 310. When the quick-release clamping rod 310 is turned, depending on the turning direction, the two grip pins 305 are moved toward each other to grip on the conductor 160 or away from each to release the conductor 160. Otherwise, the cylindrical cable grip assembly 330 locks into the keyed inner cup 240 in the same manner as the support sleeve cable grip assembly 230 of the three grip pin contact termination assembly 200 described with respect to FIGS. 4A and 4B. Likewise, the outer cup 205 and the keyed inner cup 240 are the same as that of the three grip pin contact termination assembly 200.

Figure 6:
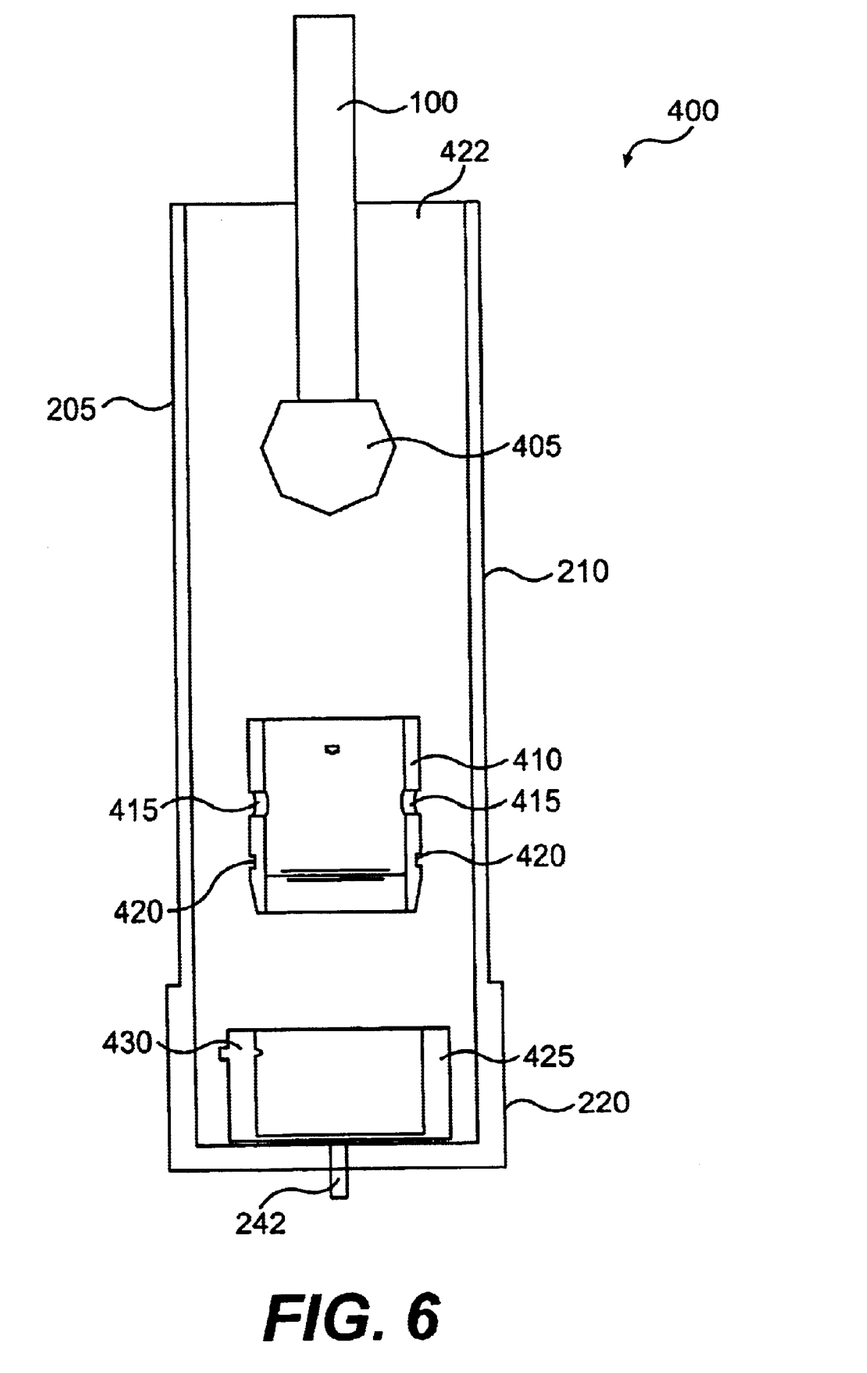
FIG. 6 is an axial cross-sectional view of a snap-on contact termination assembly according to a third embodiment of the present invention.

Turning now to a third embodiment of the present invention shown in FIG. 6, a snap-on contact termination assembly 400, is shown, which is yet another alternative design of the three grip pin contact termination assembly 200. In the snap-on contact termination assembly 400, the support sleeve cable grip assembly 230 of FIGS. 4A and 4B and its corresponding keyways are replaced with a snap-on cable grip assembly 410 containing a circumferential groove 420. In addition to the circumferential groove 420, the snap-on cable grip assembly 410 has three evenly spaced slots (not shown) running perpendicularly from the circumferential groove 420 to the bottom of the snap-on cable grip assembly 410. The three keyway pins 236 on the inner wall of the keyed inner cup 240 are replaced with three pushpins 430 in the snap-on inner cup 425.

When terminating, the conductor 160 is preferably connected to a conductive connecting ball 405, which in turn is placed in the snap-on cable grip assembly 410. The conductive ball 405 is held in the snap-on cable grip assembly 410 by set screws placed in the set screw openings 415. With the conductive connecting ball 405 attached, the snap-on cable grip assembly 410 is pushed into the snap-on inner cup 425 until the push pins 430 snap into the circumferential groove 420. When releasing the snap-on cable grip assembly 410 from the snap-on inner cup 425, the snap-on cable grip assembly 410 is turned until the push pins 430 drop into the slots (not shown). After the push pins 430 drop into the slots, the snap-on cable grip assembly 410 is then pulled, releasing it from the snap-on inner cup 425 as the push pins 430 slide through the slots. Otherwise, the outer cup 205 attaches to the snap-on inner cup 425 in a similar manner as the keyed inner cup 240 of the three grip pin contact termination assembly 200.

Figure 7:
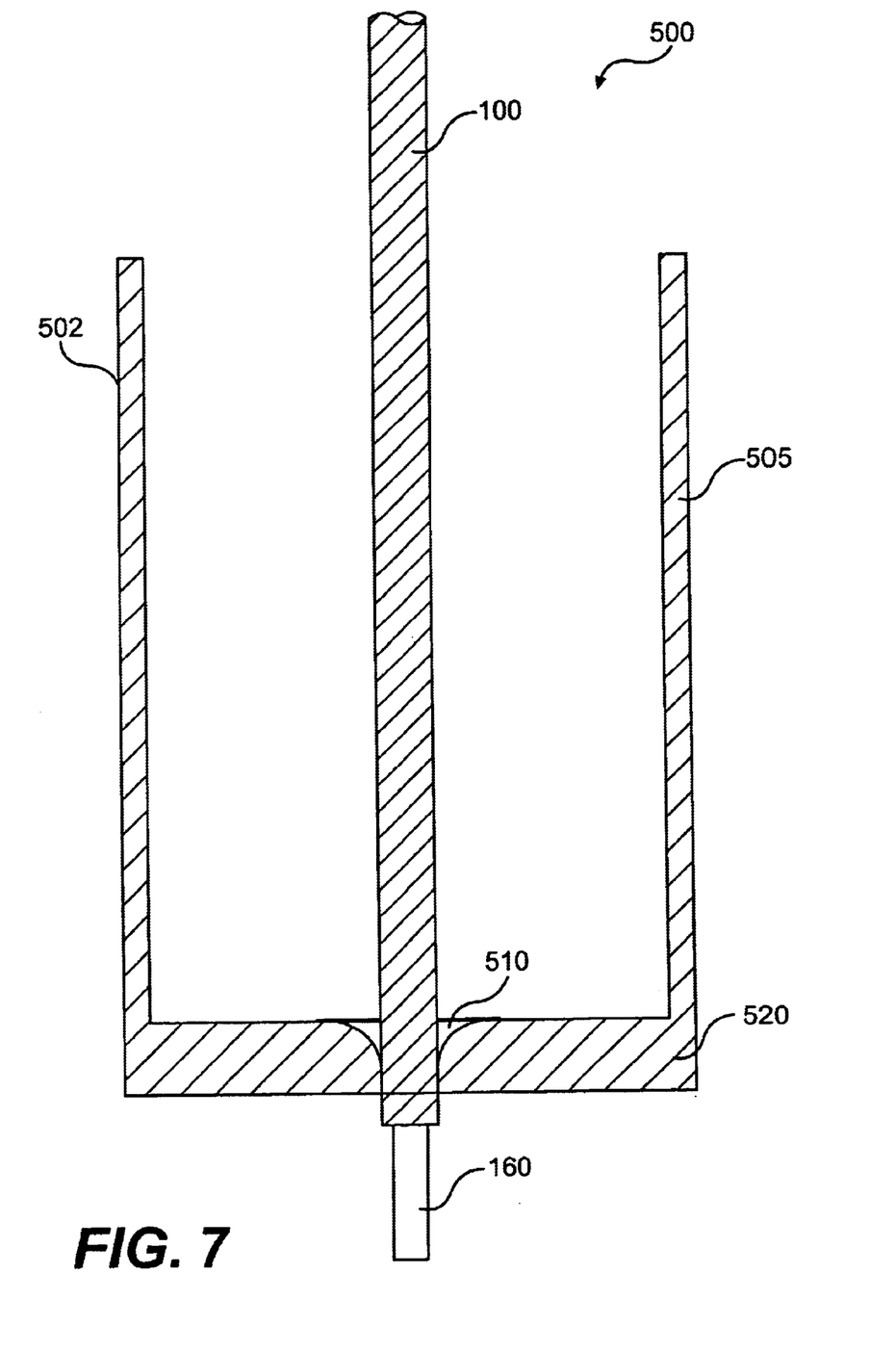
FIG. 7 is an axial cross-sectional view of a non-contact termination assembly according to a forth embodiment of the present invention.

Turning now to a fourth embodiment of the present invention in FIG. 7, the non-contact termination assembly 500, is shown, which is still yet another alternative design of the three grip pin contact termination assembly 200. The non-contact termination 500 consists of an outer cup 502 and a first tube 510. The outer cup 502 comprises a second tube 505 normally made of Acrylic, PVC, or other electrically non-conductive material, and an end cap 520 likewise made of electrically non-conductive material. The end cap 520 has an opening at the bottom for the horn-shaped first tube 510.

To assemble the non-contact termination 500, the first tube 510, sized according to the size range of the cable to be tested, is secured to the end cap 520 by two stiff rubber gaskets (not shown). The end cap 520 is then screwed on one end of the second tube 505. To install the termination, the cable 100 is prepared as described above with respect to FIG. 3 and is inserted into the outer cup 502 and then pushed through the first tube 510. The first tube 510 is sized to fit on the cable 100 to provide a tight seal. The conductor 160 protrudes from the bottom of the outer cup 502.

Figure 8:
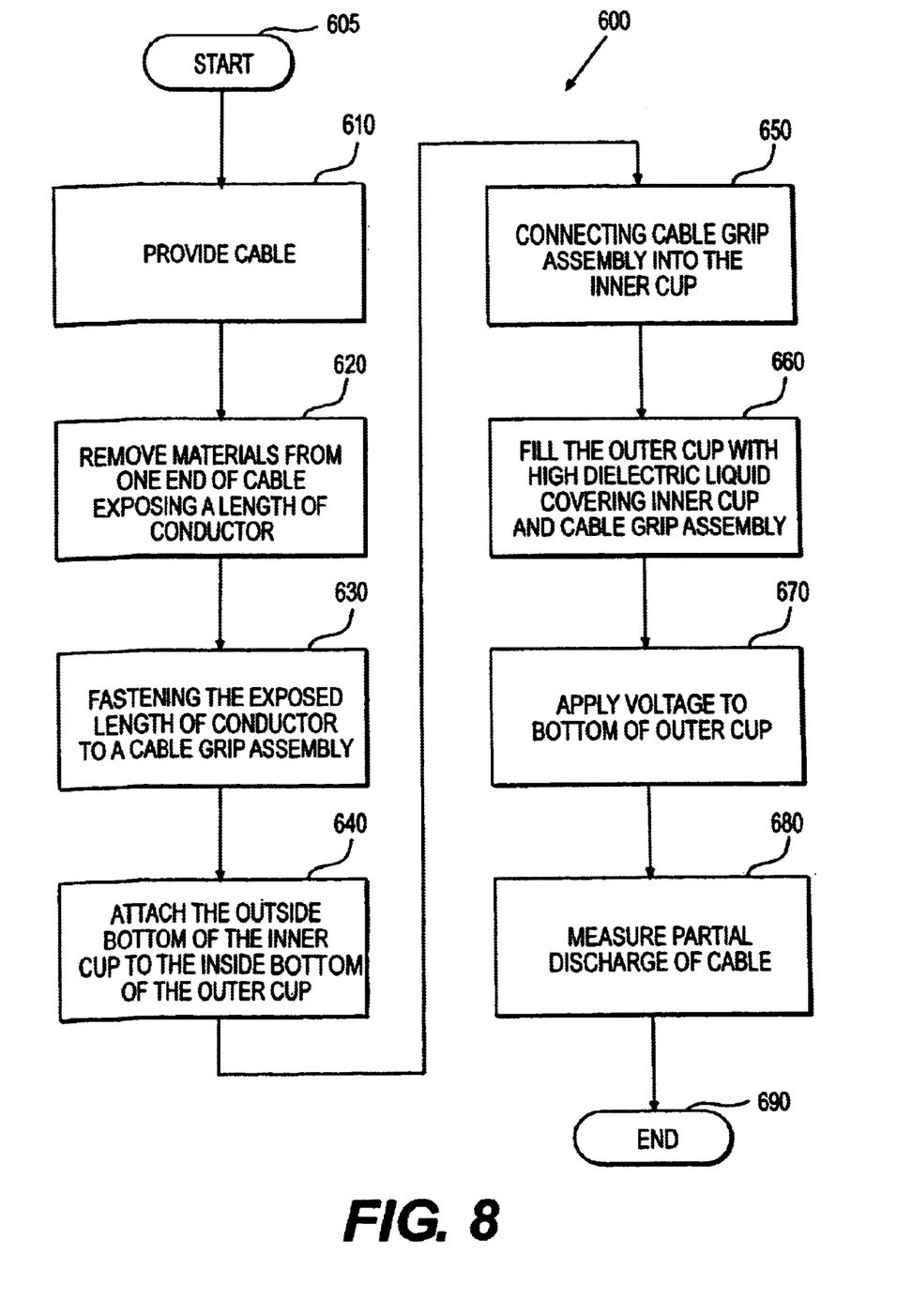
FIG. 8 is a flow chart that illustrates the general method for using the contact termination embodiments of the present invention.

Turning now to FIG. 8, a method 600 for using a contact termination assembly is show. Contact termination assemblies include the three grip pin contact termination assembly 200, the two grip pin contact termination assembly 300, and the snap-on contact termination assembly 400. Exemplary method 600 begins at starting block 605 and advance to step 610 where a cable 100 is provided. The cable 100 provided can include the types of cables described with respect to FIGS. 1 and 2. However, those skilled in the art will appreciate that other cable constructions may be employed. From step 610, method 600 advances to step 620 where materials are removed from the cable exposing a length of conductor. Details concerning the removal of materials from the conductor 100 are described with respect to the discussion of FIG. 3.

From step 620, method 600 advances to step 630 where the length of conductor 160 exposed in step 620 is attached to a cable grip assembly. The cable grip assemblies utilized in this step may include the cable grip assemblies disclosed with respect to the three grip pin contact termination assembly 200 as described with respect to FIGS. 4A and 4B, the two grip pin contact termination assembly 300 as described with respect to FIG. 5, and the snap-on contact termination assembly 400 as described with respect to FIG. 6. However, those skilled in the art will appreciate that other cable grip assemblies may be employed.

After the conductor 160 is attached to a cable grip assembly in step 630, method 600 advances to step 640 where the outside bottom of the inner cup is attached to the inside bottom of the outer cup. Generally, this is performed by screwing the inner cup to the outer cup as described with respect to the various embodiments in FIGS. 4A, 4B, 5, and 6. However, those skilled in the art will appreciate that other attaching mechanisms may be employed to attach and electrically connect the inner cup to the outer cup as described with respect to the various embodiments.

From step 640, method 600 continues to step 650 where the cable grip assembly is attached to the inner cup. With respect to the three grip pin contact termination assembly 200 and the two grip pin contact termination assembly 300, this attachment is performed utilizing keyways and keyway pins. As stated previously, three keyways are aligned with three keyway pins on the inner wall of the inner cup. The cable grip assembly is inserted until the three keyway pins reach the end of the keyways. Once the keyway pins reach the end of the keyways, the cable grip assembly is turned and locked into place. This locking is accomplished by springs which hold the keyway pins in saddle slots located in the keyways.

With respect to the snap-on contact termination assembly 400 as described with respect to FIG. 6, the attachment is performed utilizing push pins 430 and a circumferential groove 420. The snap-on cable grip assembly 410 is pushed into the snap-on inner cup 425 until the push pins 430 snap into the circumferential groove 420. When releasing the snap-on cable grip assembly 410 from the snap-on inner cup 425, the snap-on cable grip assembly 410 is turn until the push pins 430 drop into the slots (not shown). After the push pins 430 drop into the slots, the snap-on cable grip assembly 410 is then pulled, releasing it from the snap-on inner cup 425 as the push pins 430 slide through the slots.

Once the cable grip assembly is attached to the inner cup in step 650, the method advances to step 660 where the outer cup is filled with a high dielectric liquid, covering the inner cup and the cable grip assembly. For cables with strand seal 170 such as the conductor 160 as described in FIG. 1, the conductor 160 is wrapped with layers of metallic tape. The layers of metallic tape block the strand seal material and keep it from contaminating the high dielectric liquid. This high dielectric liquid may be an environmentally unfriendly compound, however, preferably the high dielectric liquid is a biodegradable environmentally friendly compound and may comprise a vegetable based or a synthetic oil. However, those skilled in the art will appreciate that other high dielectric liquids including other biodegradable environmentally friendly high dielectric liquids may be employed.

From step 660, exemplary method 600 advances to step 670 where a test voltage is applied to the bottom of the outer cup. This test voltage may be applied through a banana-type plug inserted into a hole at the bottom of the end cap and is transferred from the bottom of the outer cup, to the inner cup, to the cable grip assembly and to the conductor. The test voltage is alternating current and is generally 3 to 4 times in magnitude of the rated voltage of the cable being tested.

With the voltage applied to the conductor in step 670, the method 600 advances to step 680 where the partial discharge is measured. Generally, the requirements of the test employed is that the partial discharge (or corona) level should be below 5 pC (pico coulomb) under an electrical stress of 200 volts per mil of insulation 140. For example, a cable rated at 15 kV with insulation 140 having a thickness of 175 mils will have a test voltage of 35 kV. In addition, a cable rated at 35 kV with insulation 140 having a thickness of 345 mils will have a test voltage of 69 kV. From step 680, the method advances to step 690 where exemplary method 600 ends.

Figure 9:
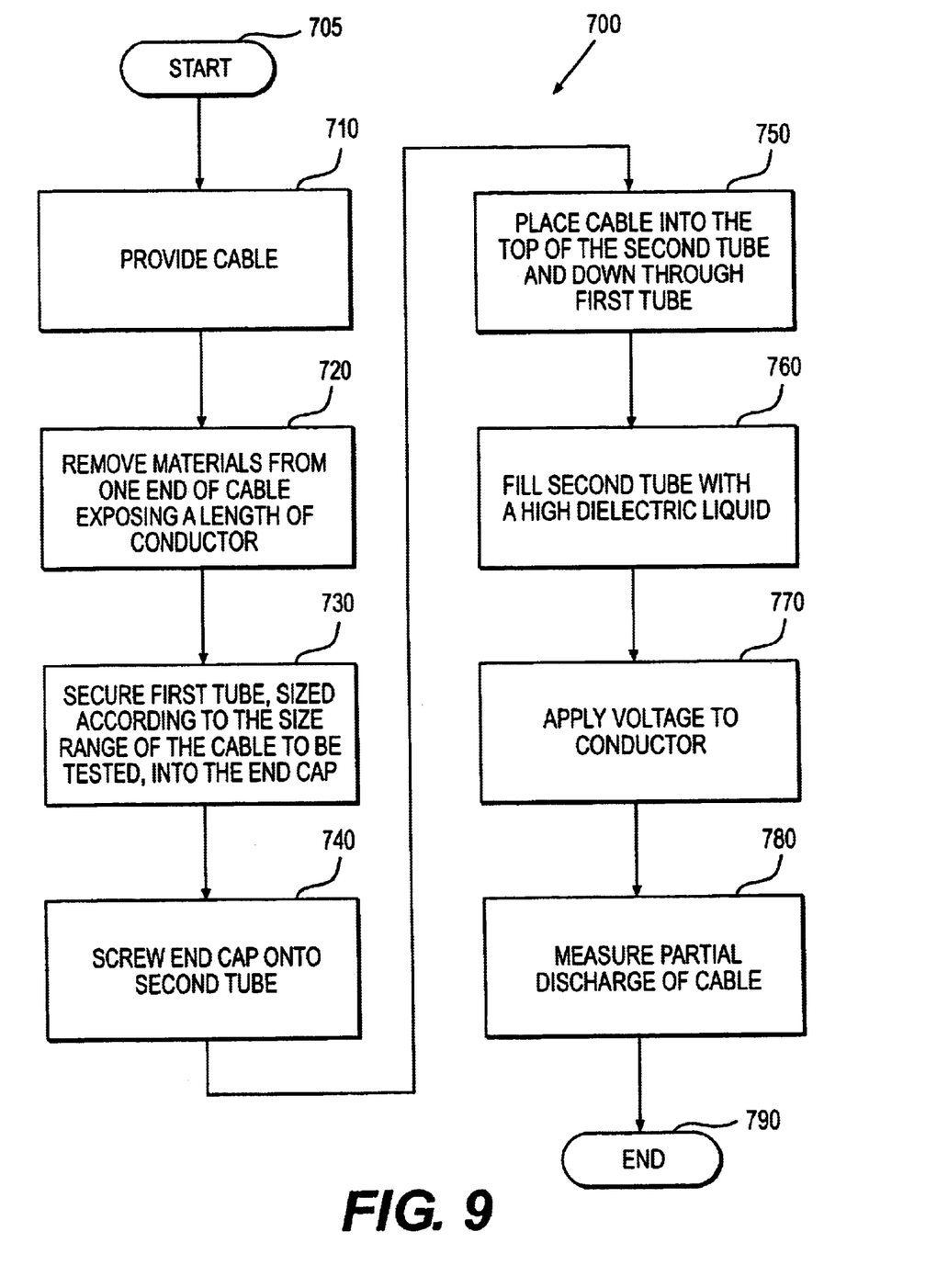
FIG. 9 is a flow chart that illustrates the general method for using the non-contact termination embodiment of the present invention.

Turning now to FIG. 9, a method 700 for using a non-contact termination assembly is shown. This assembly includes the non-contact termination assembly 500 as shown in FIG. 7. Exemplary method 700 begins at starting block 705 and advances to step 710 where a cable 100 is provided. The cable 100 provided can include the types of cables described with respect to FIGS. 1 and 2. However, those skilled in the art will appreciate that other cable constructions may be employed. From step 710, method 700 advances to step 720 where materials are removed from the cable exposing a length of conductor 100. Details concerning the removal of materials from the conductor 100 are described with respect to the discussion of FIG. 3.

From step 720, method 700 advances to step 730 where the first tube 510 is sized according to the conductor 160 and secured to the end cap 520. Rubber gaskets may be employed to secure the first tube 510, however, those skilled in the art will appreciate that other securing mechanisms may be employed. After the first tube 510 is secured to the end cap 520 in step 730, method 700 advances to step 740 where the end cap 520 is screwed onto the second tube 505. Those skilled in the art will appreciate that attaching mechanisms other than screwing may be employed to attach and seal the end cap 520 to the second tube 505.

From step 740, method 700 continues to step 750 where the cable 100 is placed into the top of the second tube 505 and down through the first tube 510, wherein the conductor 160 protrudes from the end cap 520. Once the cable is placed in step 750, the method advances to step 760 where the outer cup 502 is filled with a high strength dielectric fluid through a hose connected to a valve (not shown) installed near the bottom of the second tube 505. Compared to the method 600 for using contact terminations, the dielectric fluid does not come in contact with the cable conductor in exemplary method 700. This high dielectric liquid may be an environmentally unfriendly compound, however, preferably the high dielectric liquid is a biodegradable environmentally friendly compound and may comprise a vegetable based or a synthetic oil. However, those skilled in the art will appreciate that other high dielectric liquids including other biodegradable environmentally friendly high dielectric liquids may be employed.

From step 760, exemplary method 700 advances to step 770 where a test voltage is applied to the conductor 160. The test voltage is generally alternating current and is 3 to 4 times in magnitude the rated voltage of the cable tested. With the voltage applied to the conductor 160, method 700 advances to step 780 where the partial discharge is measured. Generally, the requirements of the test employed is that the partial discharge (or corona) level should be below 5 pC (pico coulomb) under an electrical stress of 200 volts per mil of insulation 140. For example, a cable rated at 15 kV with insulation 140 having a thickness of 175 mils will have a test voltage of 35 kV. In addition, a cable rated 35 kV with insulation 140 having a thickness of 345 mils will have a test voltage of 69 kV. From step 780, the method advances to step 790 where exemplary method 700 ends.

In view of the foregoing, it will be appreciated that the present invention provides a termination assembly for a cable and its method of use. Still, it should be understood that the foregoing relates only to the exemplary embodiments of the present invention, and that numerous changes may be made thereto without departing from the spirit and scope of the invention as defined by the following claims.

What is claimed is:

1. A method for testing an electrical power cable having a first length of exposed conductor and a second length of materials layered around the conductor, the materials including insulation, comprising the steps of:

fastening removeably the first length of the conductor in a cable grip assembly;

connecting mateably the cable grip assembly to the inside of an outer cup;

filling at least a portion of the outer cup with a high dielectric strength liquid to cover the cable grip assembly; and applying a voltage to the bottom of the outer cup, the voltage transferring from the bottom of the outer cup, to the cable grip assembly, and to the first length of the conductor.

2. The method of claim 1, wherein the connecting step further comprises the steps of:

attaching the bottom outer surface of an inner cup to the inner bottom surface of the outer cup, the inner cup fully contained in the outer cup; and connecting mateably the cable grip assembly into the top of the inner cup, the inner cup completely containing the cable grip assembly.

3. The method of claim 2, wherein the connecting step further comprises:

aligning keyway pins with keyways, the keyway pins protruding from the interior of the inner cup toward the center of the inner cup, and the keyways placed in the exterior of the cable grip assembly; and locking the keyway pins in the keyways, wherein the cable grip assembly and the inner cup are electrically and physically connected.

4. The method of claim 2, wherein the connecting step further comprises:

snapping push pins into a circumferential groove the push pins protruding from the interior of the inner cup toward the center of the inner cup, and the circumferential groove placed in the exterior of the cable grip assembly;

wherein the cable grip assembly and the inner cup are electrically and physically connected.

5. The method of claim 2, wherein the fastening step further comprises:

attaching a conductive sphere to the first length of the conductor;

placing the conductive sphere in the cable grip assembly; and fastening the conductive sphere in the cable grip assembly.

6. The method of claim 2, further comprising the step of measuring a partial voltage discharge of the cable to determine the quality of the insulation.

7. The method of clam 2, wherein the fastening step further comprises applying layers of metallic tape around the first length of the conductor.

8. The method of claim 1 wherein the high dielectric strength liquid comprises an environmentally friendly compound.

9. The method of claim 8, wherein the environmentally friendly compound comprises at least one of the following materials:

a vegetable based oil and a synthetic oil.

10. The method of claim 1, wherein the outer cup comprises:

a tube made of an electrically non-conductive material; and an end cap mateably connecting to one end of the tube, the end cap made of an electrically conductive material.

11. A cable termination apparatus comprising:

a cable grip assembly configured to removeably grasp and electrically connect to a first end of a conductor associated with a first end of a cable; and an outer cup mateably attached to the cable grip assembly, the outer cup containing a high dielectric fluid covering the cable grip assembly and covering a length of the first end of the conductor, the outer cup including a tube made of an electrically non-conductive material and an end cap mateably connecting to one end of the tube, the end cap made of an electrically conductive material.

12. The apparatus of claim 11, further comprising an inner cup mateably attached around and electrically connected to the cable grip assembly, the outer cup mateably attached around and electrically connected to the inner cup.

13. The apparatus of claim 12, further comprising a voltage source configured to supply voltage to the first end of the conductor via the outer cup, the inner cup, and the cable grip assembly.

14. The apparatus of claim 13, wherein the cable grip assembly comprises:

a support sleeve;

grip pins slideably connected to the interior of the support sleeve and operable collectively to grasp the first end of the conductor; and a piston rotatable in a first direction to cause the grip pins to grasp and electrically connect to the first end of the conductor, and rotatable in a second direction to cause the grip pins to release and electrically disconnect from the first end of the conductor.

15. The apparatus of claim 12, wherein the cable grip assembly comprises:

a support sleeve;

a clamping rod traversing the interior of the support sleeve, the clamping rod operable for rotating in a first direction and in a second direction; and opposing grip pins operable for moving along the clamping rod and operable collectively to grasp the first end of the conductor, the clamping rod rotatable in a first direction to cause the grip pins to grasp and electrically connect to the first end of the conductor, and rotatable in a second direction to cause the grip pins to release and electrically disconnect from the first end of the conductor.

16. The apparatus of claim 12, further comprising:

keyway pins protruding from the interior of the inner cup toward the center of the inner cup; and keyways placed in the exterior of the cable grip assembly in alignment with the keyway pins, the keyway pins lockingly attaching in the end of the keyways and electrically connecting the cable grip assembly to the inner cup.

17. The apparatus of claim 12, further comprising:

a circumferential groove placed in the exterior of the cable grip assembly; and push pins protruding from the interior of the inner cup toward the center of the inner cup, wherein the push pins snap into the circumferential groove, lockingly attach and electrically connect the cable grip assembly to the inner cup.

18. The apparatus of claim 12, further comprising:

slots placed in the exterior of the cable grip assembly, the slots perpendicular to the circumferential groove and extending from the circumferential groove to the end of the cable grip assembly opposite the end that received the conductor; and wherein the cable grip assembly is released from the inner cup by rotating the cable grip assembly until the push pins align with the slots and pulling the cable grip assembly from the inner cup as the push pins slide through the slots.

19. The apparatus of claim 12, wherein the conductor is solid.

20. The apparatus of claim 12, wherein the conductor is made of at least one of the following materials:

copper, aluminum, and aluminum alloy.

21. The apparatus of claim 12, wherein the conductor is stranded.

22. The apparatus of claim 21, wherein metallic tape is placed around the conductor.

23. The apparatus of claim 21, wherein the conductor is filled with strand seal and metallic tape is placed around the conductor.

24. The apparatus of claim 12, wherein the conductor is insulated, the insulation is made of at least one of the following materials:

polyethylene, crosslinked polyethylene, and ethylene-propylene rubber.

25. The apparatus of claim 11 wherein the high dielectric strength liquid comprises an environmentally friendly compound.

26. The apparatus of claim 25, wherein the environmentally friendly compound comprises at least one of the following materials:

a vegetable based oil and a synthetic oil.

* * * * *

UNITED STATES PATENT AND TRADEMARK OFFICE
CERTIFICATE OF CORRECTION

PATENT NO. : 6,621,276 B2
DATED : September 16, 2003
INVENTOR(S) : Yingli Wen et al.

It is certified that error appears in the above-identified patent and that said Letters Patent is hereby corrected as shown below:

<u>Title page,</u>
Item [75], Inventors, "Lexington, SC" should read -- New Rochelle, NY --.

Signed and Sealed this

Thirtieth Day of March, 2004

JON W. DUDAS
*Acting Director of the United States Patent and Trademark Office*